United States Patent
Wu et al.

(10) Patent No.: US 7,466,585 B2
(45) Date of Patent: Dec. 16, 2008

(54) MAGNETIC RANDOM ACCESS MEMORY

(75) Inventors: Chih-Huo Wu, Hsinchu (TW);
Chih-Huang Lai, Hsinchu (TW);
Yu-Jen Wang, Hsinchu (TW); Denny Tang, Saratoga, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 230 days.

(21) Appl. No.: 11/380,777

(22) Filed: Apr. 28, 2006

(65) Prior Publication Data

US 2007/0253244 A1 Nov. 1, 2007

(51) Int. Cl.
*G11C 11/14* (2006.01)

(52) U.S. Cl. .................. 365/171; 365/173; 365/158; 365/213

(58) Field of Classification Search .......... 365/171, 365/173, 158, 213, 225.5; 257/E21.665, 257/421, 467
See application file for complete search history.

(56) References Cited

U.S. PATENT DOCUMENTS

| | | | |
|---|---|---|---|
| 5,361,226 A | | 11/1994 | Taguchi et al. |
| 5,528,564 A | | 6/1996 | Kryder et al. |
| 6,611,455 B2 * | | 8/2003 | Sekiguchi et al. ........... 365/171 |
| 6,879,515 B2 * | | 4/2005 | Yoda et al. .................. 365/158 |
| 6,910,382 B2 * | | 6/2005 | Tang et al. ..................... 73/722 |
| 6,980,470 B2 * | | 12/2005 | Ohmori ...................... 365/171 |
| 7,110,287 B2 * | | 9/2006 | Huai et al. .................. 365/171 |
| 7,295,460 B2 * | | 11/2007 | Ezaki et al. ................. 365/158 |
| 2004/0095801 A1 | | 5/2004 | Stipe |

* cited by examiner

*Primary Examiner*—David Lam
(74) *Attorney, Agent, or Firm*—Baker & McKenzie LLP

(57) ABSTRACT

An apparatus and methods for a non-volatile magnetic random access memory (MRAM) device that includes a word line, a bit line, and a magnetic thin film memory element located at an intersection of the word and bit lines. The magnetic thin film memory element includes an alloy of a rare earth element and a transition metal element. The word line is operable to heat the magnetic thin film memory element when a heating current is applied. Heating of the magnetic thin film memory element to a predetermined temperature reduces its coercivity, which allows switching of the magnetic state upon application of a magnetic field. The magnetic state of the thin film element can be determined in accordance with principles of the Hall effect.

20 Claims, 10 Drawing Sheets

MAGNETIC RANDOM ACCESS MEMORY

TECHNICAL FIELD

Disclosed embodiments herein relate generally to nonvolatile memory, and more particularly to magnetic random access memory (MRAM) cells, MRAM memory arrays, and a method using the same.

BACKGROUND

Magnetic random access memory (MRAM) is a type of non-volatile memory that uses magnetism rather than electrical power to store data. Conventional MRAM cells are described in U.S. patent application Ser. No. 10/907,977, entitled "Magnetic Random Access Memory Device," by Jhon Jhy Liaw, and are herein incorporated by reference.

FIG. 1 illustrates a cross-sectional view 100 of a known magnetic tunnel junction (MTJ) MRAM cell. A typical MTJ MRAM cell includes a layer of insulating material 102 sandwiched between two electrodes of magnetic material. The insulating material 102 is also called a tunneling barrier. One electrode is a fixed ferromagnetic layer 104 that creates a strong pinning field to hold the magnetic polarization thereof in one specific direction. The other electrode is a free ferromagnetic layer 106 which is free to rotate and hold polarization in one of two directions. The free ferromagnetic layer 106 is connected to a top electrode and led to a bit line 108. The fixed ferromagnetic layer 104 is connected to a bottom electrode leading to a word line 110.

Similar to other types of magnetic memory cells, the MTJ MRAM cell has a low logical state and a high logical state associated with a low resistance state and a high resistance state respectively, or vice-versa. When the fixed ferromagnetic layer 104 and the free ferromagnetic layer 106 have the same polarization for their magnetic fields, the MTJ MRAM cell will be in a low resistance state. When their polarizations are opposite, the MTJ MRAM cell will be in a high resistance state. The resistance state can be read or detected by having a current flow from one magnetic layer to the other through the insulating material 102. The high or low resistance state determines the output current from an MRAM cell. Conventionally, a sense amplifier is used to compare the output current with a reference cell.

Conventional MRAM cells have several limitations. One limitation is that of speed in reading data from the cells. Currently, logic circuits are operating at frequencies in the GHz ranges. However, conventional MRAM devices are constrained to operate at much slower rates, causing a significant performance gap between the logic and the MRAM memory. This performance gap results in a suboptimal performance of the logic circuits because supporting MRAM memory devices cannot provide data and instructions fast enough. Thus, this results in a bottleneck effect at the MRAM devices, particularly in System on Chip (SoC) designs, which combine memory with logic circuitry on a chip.

SUMMARY

Disclosed herein are magnetic random access memory (MRAM) cells, MRAM memory arrays, and a method using the same. A magnetic state of the cell may be written using thermally-assisted writing of a logical state. The cell may be read using principles in accordance with the Hall effect.

In an exemplary embodiment, an MRAM cell includes a word line, a bit line, and a magnetic thin film memory element located at an intersection of the word line and the bit line. The magnetic thin film memory element includes an alloy of a rare earth element and a transition metal element. The word line is operable to heat the magnetic thin film memory element when a heating current is applied.

An MRAM cell may be written to by applying a heating current to a word line to heat a magnetic memory layer to a threshold temperature. When the threshold temperature is met, a current is applied to a line (parallel to the word line) to generate a magnetic field. Heating the magnetic memory layer reduces the coercivity of the magnetic layer. The heating current in combination with the magnetic field switches the magnetic state of the magnetic memory layer.

An MRAM cell may be read by applying a read current to a word line. A magnetic field from the applied read current exerts a transverse force on the moving charge carriers in the thin film memory element, pushing them to one side of the element. In accordance with the principles of the Hall effect, the voltage across the thin film memory element may be measured. The voltage will have a positive polarity associated with a first logical state and a negative polarity associated with a second logical state. Thus, depending on the magnetization direction stored in the thin film element, the logical state can be determined.

An MRAM cell may be manufactured by forming a word line, forming a bit line, and forming a magnetic thin film memory element located at an intersection of the word line and the bit line. The magnetic thin film memory element that is formed includes an alloy of a rare earth element and a transition metal element. The word line that is formed is operable to heat the magnetic thin film memory element when a heating current is applied.

BRIEF DESCRIPTION OF THE DRAWINGS

For a more complete understanding of the principles disclosed herein, and the advantages thereof, reference is now made to the following descriptions taken in conjunction with the accompanying drawings, in which:

FIG. 4A shows an enlarged portion of the graph of FIG. 4, in accordance with the teachings of the present disclosure;

DETAILED DESCRIPTION

Figure 1:
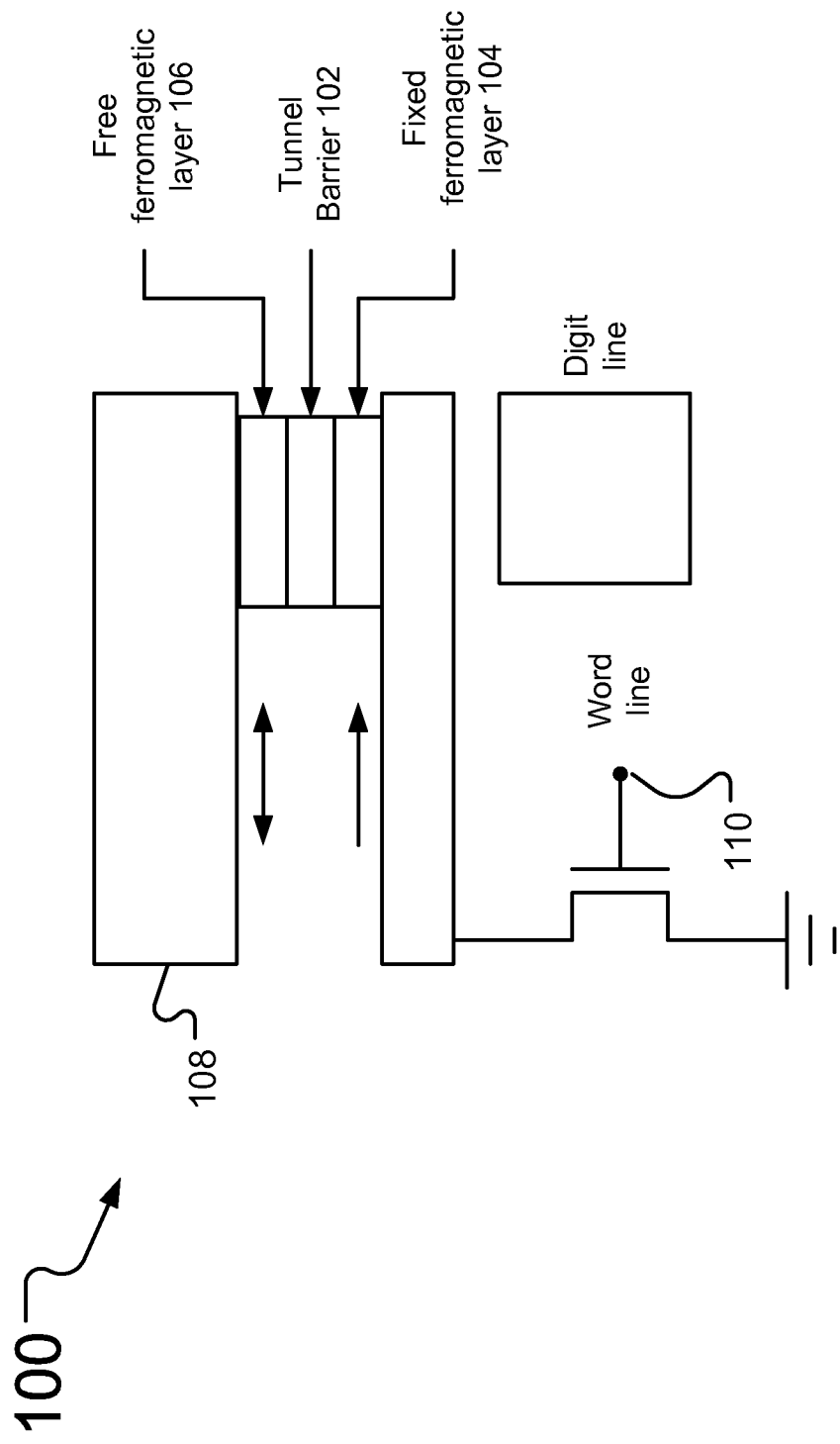
FIG. 1 shows a schematic diagram of a known MRAM cell that does not incorporate the teachings of the present disclosure.
Figure 2:
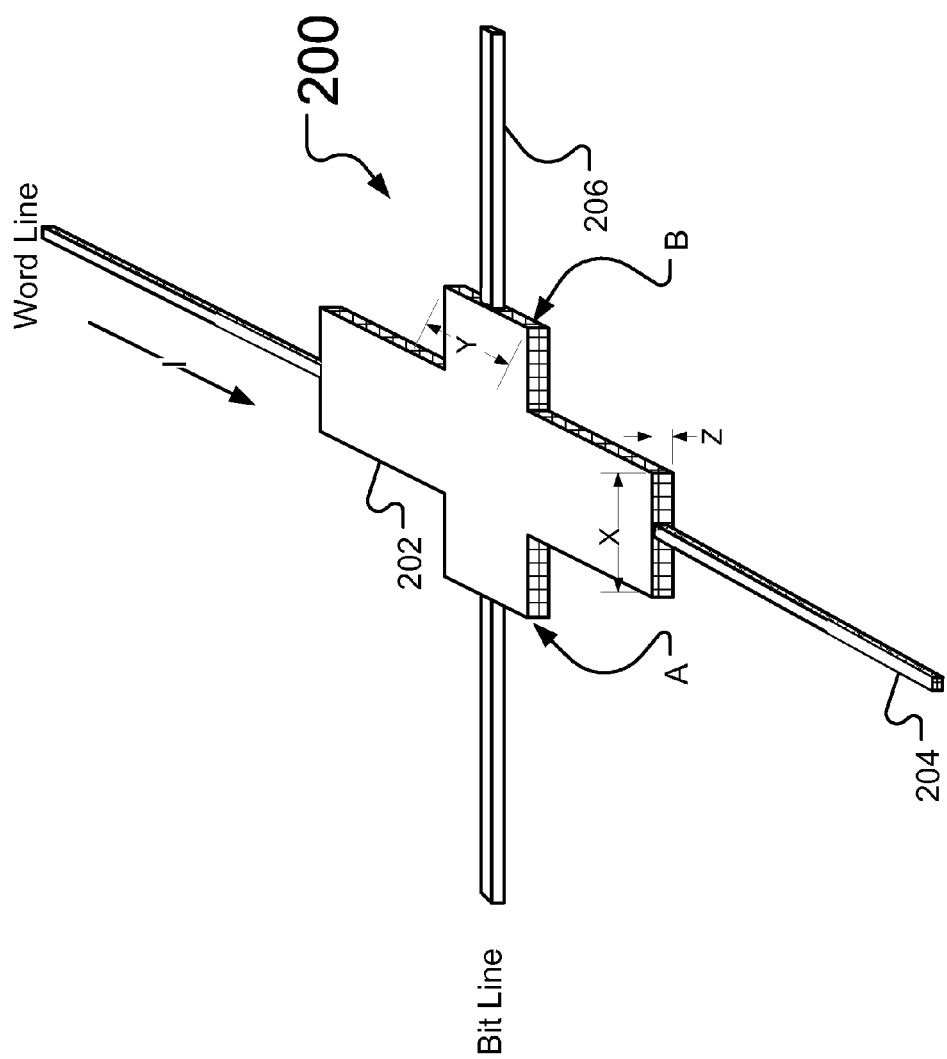
FIG. 2 shows a schematic diagram of a first embodiment of an MRAM cell in accordance with the teachings of the present disclosure.

FIG. 2 shows a schematic diagram of a first embodiment of an MRAM cell 200. MRAM cell 200 includes a thin film magnetic memory layer 202, a word line 204, and a bit line 206. Magnetic memory layer 202 is fabricated of a ferromagnetic material, such as an alloy of a rare earth metal and a transition metal (RE-TM alloy). Examples of such a RE-TM alloy include terbium iron cobalt (TbFeCo), terbium cobalt (TbCo), RE-cobalt palladium (RE-CoPd), RE-cobalt platinum (RE-CoPt), and the like. For example, a formulation (in atomic percentage) tested in the laboratory was $Tb_{29.2}Co$. The thin film magnetic memory layer 202 tested in the laboratory had a horizontal dimension (shown by X) of 100 microns, and a vertical dimension (shown by dimension Y) of 100 microns, with a thickness (shown by dimension Z) of 10 nm. Of course, other dimensions and pattern sizes may be used, these are provided merely as examples that may be used to practice the teachings of the present disclosure.

In operation, generally the MRAM cell 200 may be written to by first applying a current to the word line 204 which heats the thin film memory layer 202 to a threshold temperature. The action of heating to the threshold temperature reduces the coercivity of the thin film magnetic layer 202. As used here, coercivity is the level of demagnetizing force that would need to be applied to reduce the permanent magnetization to zero. Coercivity is the property of the magnetic thin film memory layer 202 that indicates its resistance to demagnetization and determines the maximum signal frequency that can be recorded by the memory element. $H_c$ is the common abbreviation for coercivity.

A demagnetizing field of a level in excess of the coercivity must be applied to a magnetic particle in order to coerce it to change the direction of its magnetization. Now that the coercivity is reduced, the magnetic state may be flipped with a reduced applied magnetization force. This is because current-induced heating lowers the anisotropy of the thin-film memory layer 202 and reduces the current density required for field or spin-transfer-based writing.

Figure 3:
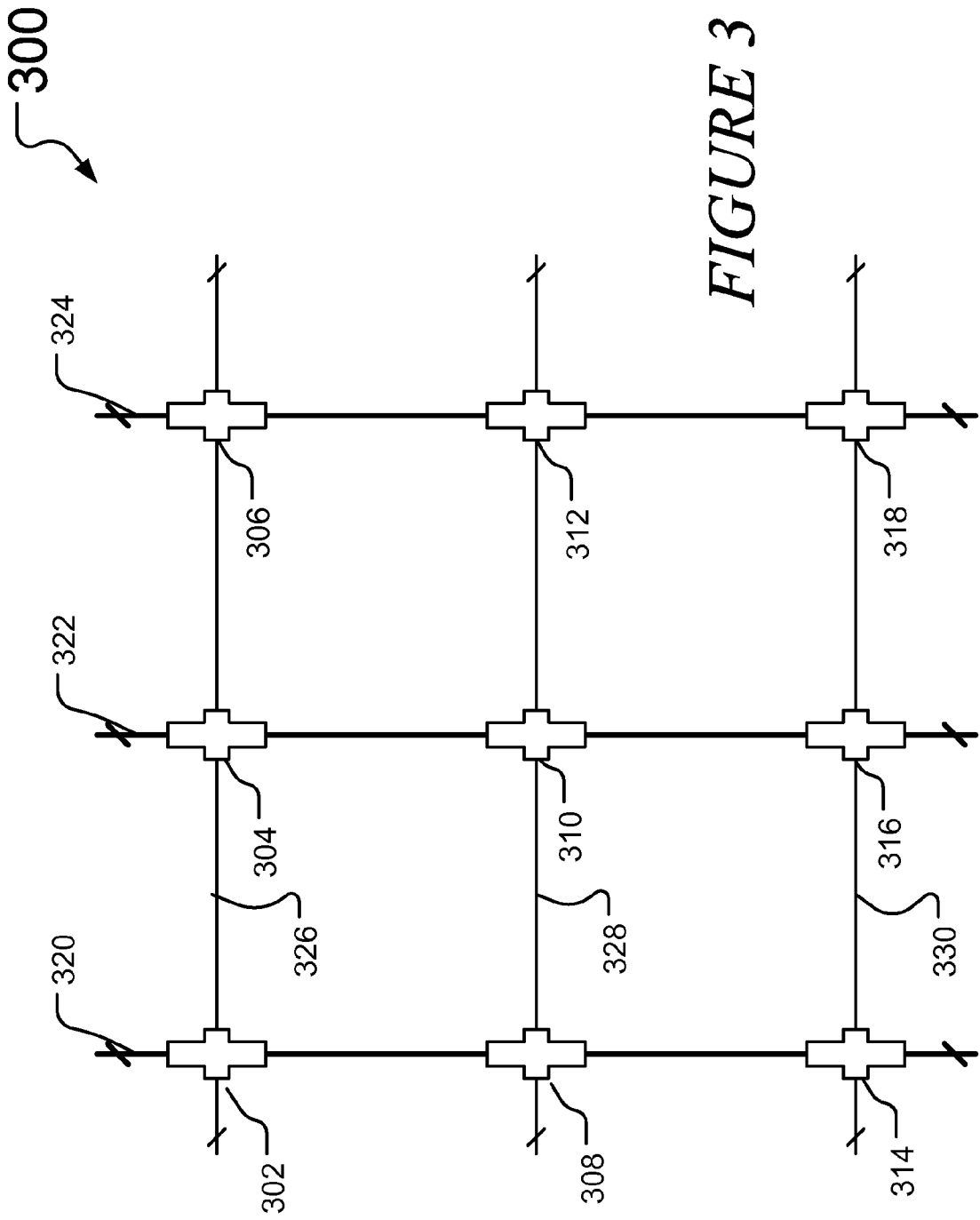
FIG. 3 shows a schematic diagram of an array of MRAM cells consistent with the first embodiment described in FIG. 2.

FIG. 3 shows a schematic diagram of an array of MRAM cells 300 consistent with the first embodiment described in FIG. 2. The MRAM cell array 300 shows an exemplary 3×3 matrix of MRAM cells, although a person of average skill in the art will be able to take the MRAM cells and create an array of N×N to produce a memory array of desired memory size and scale.

MRAM cell array 300 includes thin film memory elements 302-318, which are arranged on parallel word lines 320-324, and parallel bit lines 326-330 that are perpendicular to the word lines 320-324, as shown in the figure. In operation, as previously described, a current is applied to a word line (e.g., 322) to heat a selected cell (e.g., 310). Upon sufficient heating of thin film memory element 310, a current is applied through an adjacent word line e.g., 320 and/or 324 to apply an appropriate magnetic field to change the magnetization state of the thin film memory element 310. For instance, the current direction through word line 320 and/or 324 will influence the magnetic field factor that will be upon the thin film memory element 310, and if a current is applied in one direction through word line 320 and in the opposite direction through word line 324, this will provide a magnetizing force in the same direction through thin film memory element 310.

Figure 4:
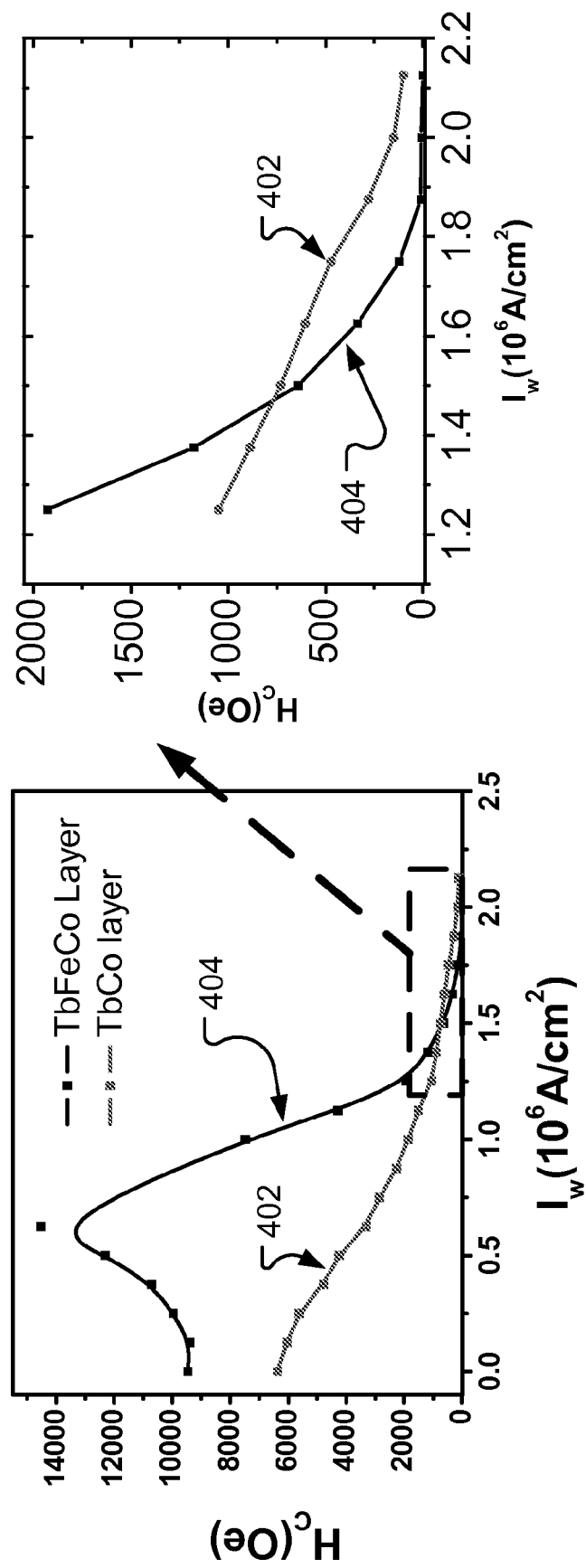
FIG. 4 shows a graph illustrating the relationship of coercivity to current for two transition metal/earth metal alloys.

FIG. 4 shows a graph illustrating the relationship of coercivity to current for an alloy of a transition metal and an earth metal. In particular, line 402 shows the relationship for a terbium cobalt layer (TbCo), where the percentage of terbium is 29.2 percent in the alloy. Line 404 shows the coercivity to current relationship for a Terbium Iron Cobalt layer (TbFeCo). Generally, as the writing current is increased, the coercivity in the material decreases. Thus, as shown in FIG. 4A, coercivity is of a sufficiently small magnitude at a current of $2.2\times10^6$ A/cm$^2$. This means that if a current of $2.2\times10^6$ A/cm$^2$ is passed through a word line (e.g., 322 of FIG. 3). Then a thin film memory element (e.g., 310) will be heated sufficiently to switch the magnetization with relative ease and a small magnitude of a magnetic force vector in a particular direction.

Figure 5:
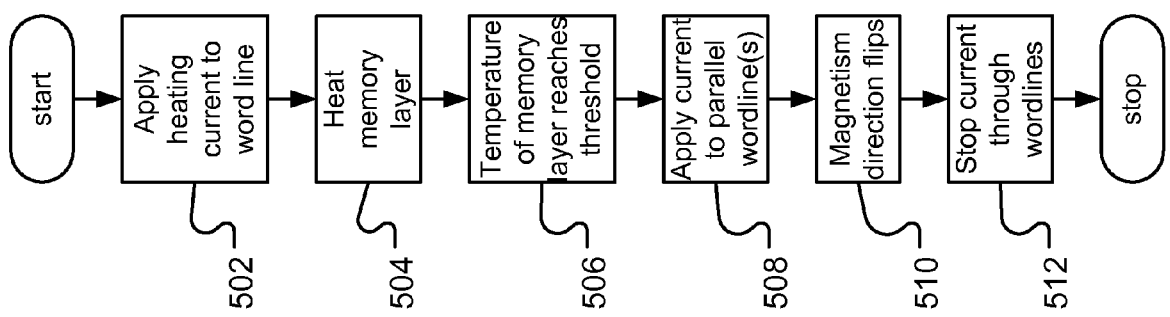
FIG. 5 shows a logical flow diagram of a write operation consistent with the first embodiment of the MRAM cell described in FIG. 2.

FIG. 5 shows a logical flow diagram of a write operation consistent with the first embodiment of the MRAM cell 200 described in FIG. 2. The method begins by applying a heating current to the word line at 502. An example current would be around $2.2\times10^6$ A/cm$^2$. Then the memory layer is heated at 504, and the temperature of the memory layer reaches a threshold, at 506. Next a current is applied to a parallel word line (or both parallel word lines) wherein the current is sufficient to flip the magnetization state of the thin film memory element, at 508. Next, the magnetism direction through the thin film memory element flips, at 510, then the current flow through the word lines is stopped, at 512.

Figure 6:
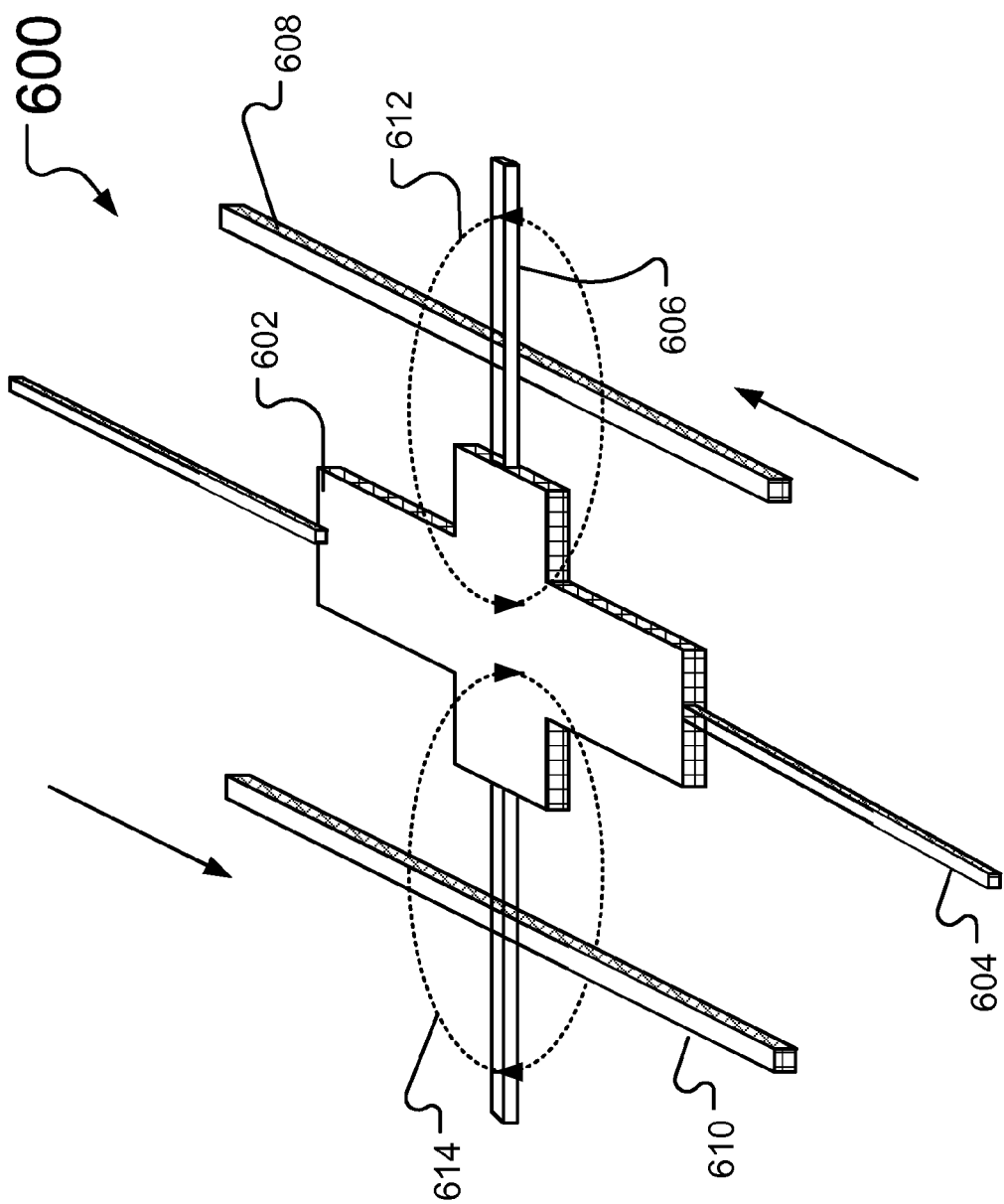
FIG. 6 shows a schematic diagram of a second embodiment of an MRAM cell in accordance with the teachings of the present disclosure.

FIG. 6 shows a schematic diagram of a second embodiment of an MRAM cell 600. MRAM cell 600 includes a thin film memory element 602, a word line 604, a bit line 606, and write lines 608-610 that are parallel to word line 604. The second embodiment operates in a similar principle to the first embodiment, except the additional write lines 608-610 may be used to pass a current therethrough to provide a magnetizing field vector to influence the magnetization of thin film memory element 602. For example, if a current is passed through write line 608 in a direction toward the page and another current is passed through write line 610 in an opposite direction, away from the page, then the resultant magnetic field vector through thin film memory element 602 will be in a parallel direction so each write line 608 and 610 may work together to influence the magnetization of thin film memory element 602.

Figure 7:
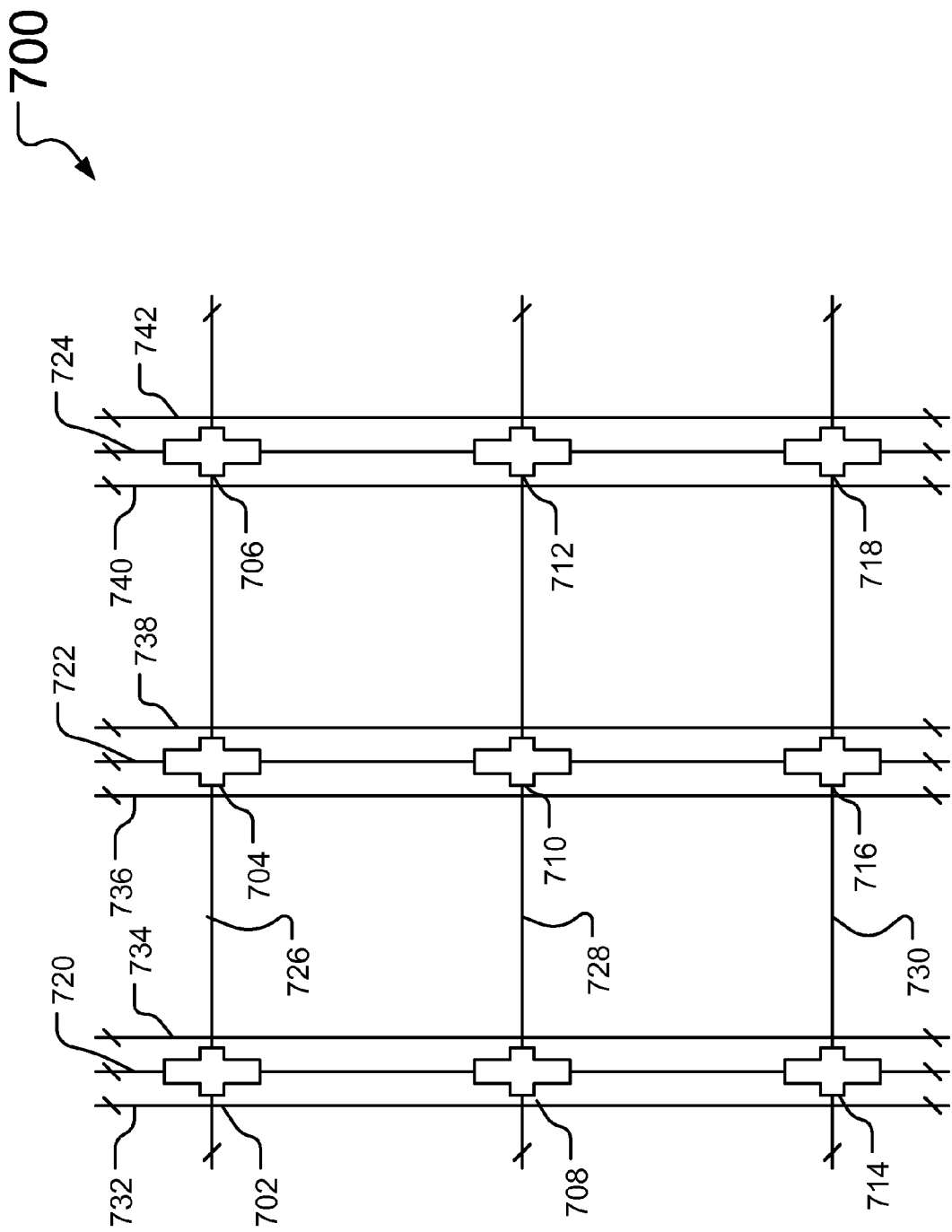
FIG. 7 shows a schematic diagram of an array of MRAM cells consistent with the second embodiment described in FIG. 6.

FIG. 7 shows a schematic diagram of an array of MRAM cells 700. MRAM cell array 700 includes thin film memory elements 702-718 which are located at the intersection of word lines 720-724 and perpendicular bit lines 726-730, as shown in the figure. MRAM cell array 700 also includes parallel write lines 732-742, through which a current may be passed to generate magnetic fields, as appropriate.

Whereas in the example of the first embodiment, in writing to a thin film memory element, a writing current was applied to adjacent word lines, the second embodiment differs in that a magnetizing force is instead generated by applying current through the appropriate write lines selected from 732-742. As would be appreciated by one of average skill in the art, this MRAM cell array 700 can be extended in various directions to produce a memory of a much larger size and capacity in accordance with the principles of the present disclosures.

Figure 8:
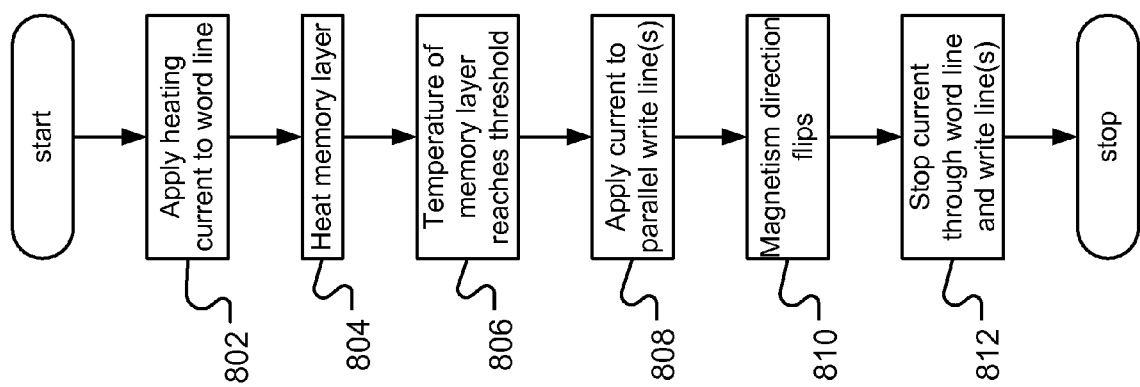
FIG. 8 shows a logical flow diagram of a write operation consistent with the second embodiment of the MRAM cell described in FIG. 6.

FIG. 8 shows a logical flow diagram of a write operation consistent with a second embodiment of the MRAM cell 600 described in FIG. 6. The method starts by applying a heating current to a word line, at 802. This heating current heats a memory layer, at 804. The temperature of the thin film memory layer reaches a threshold at 806 and a current is then applied to the parallel write line(s) that are associated with the thin film memory layer, at 808. Upon a sufficient magnetizing force for the temperature of the thin film memory element, the magnetism direction flips in accordance with the magnetizing field from the write lines, at 810. Next, current flow to the word line and write line(s) is stopped, at 812.

Figure 9:
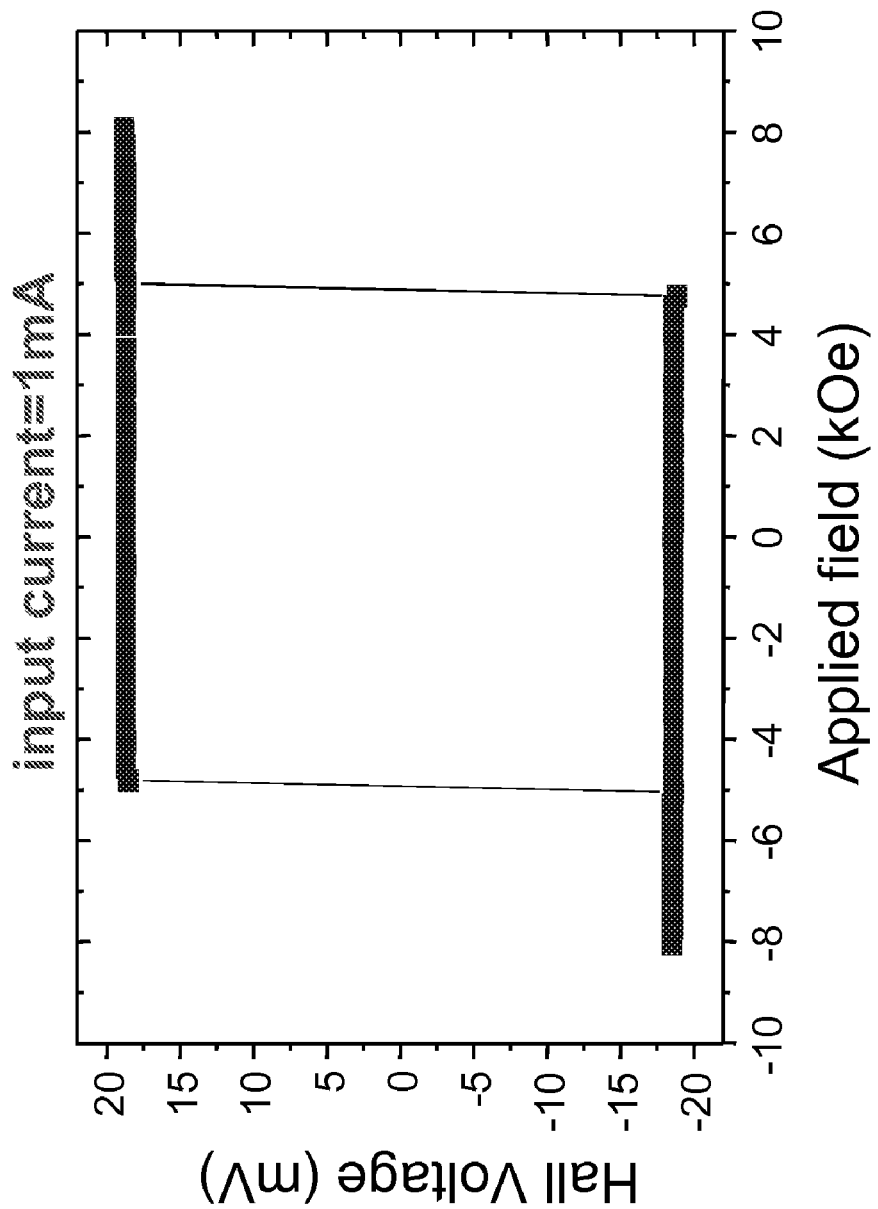
FIG. 9 shows a graph illustrating the relationship between Hall voltage and an applied magnetic field.

FIG. 9 shows a graph illustrating the relationship between Hall voltage and an applied magnetic field that is useful with respect to a read operation of both the first and the second embodiments of the MRAM cells. Generally a read operation is performed by applying a small current through the word line (e.g., 1 milliamp). Under the principles of the Hall effect, if an electric current flows through a conductor in a magnetic field, the magnetic field exerts a transverse force on the moving charge carriers which tends to push them to one side of the magnetic thin film element. A build up of charge at the sides of the magnetic thin film element will balance this magnetic influence, producing a measurable voltage between the two sides of the element. Thus, depending on the magnetization of the thin film memory element, the polarity of this measured transverse voltage will reveal a first state or a second state. The positive Hall voltage may, for instance, be associated with a high logical state, and a negative Hall voltage may conversely be associated with a low logical state, or vice-versa.

The Hall resistivity in ferromagnetic metals and alloys in a polycrystalline form is given by:

$$\rho_H = R_0 B + \mu_0 R_S M_S$$

where $R_0$ is the ordinary Hall constant, $R_S$ is the extraordinary or spontaneous Hall constant, B is the magnetic induction, $M_s$ is the saturation magnetization, and $\mu_0$ is the permeability of the free space. The first term is due to the Lorentz force acting on the charge carriers and is present in nonmagnetic materials as well. The second term is a characteristic of the magnetic state of the material and is proportional to the magnetization. Generally, in the materials tested in the laboratory, e.g., TbCo and TbFeCo, $R_0$ is much less than $R_S$, thus $\rho_H \approx \mu_0 R_S M_S$.

As FIG. 9 shows, when an input current of 1 milliamp is flowed through a word line, a Hall voltage generally between 18 and 20 millivolts may be generated when the thin film memory element is in a first state, and a Hall voltage of in the range minus 18 to minus 20 millivolts may be generated when the magnetization is in the opposite, second state. Thus there is a difference of about 40 mV between the first and second state of magnetization.

Figure 10:
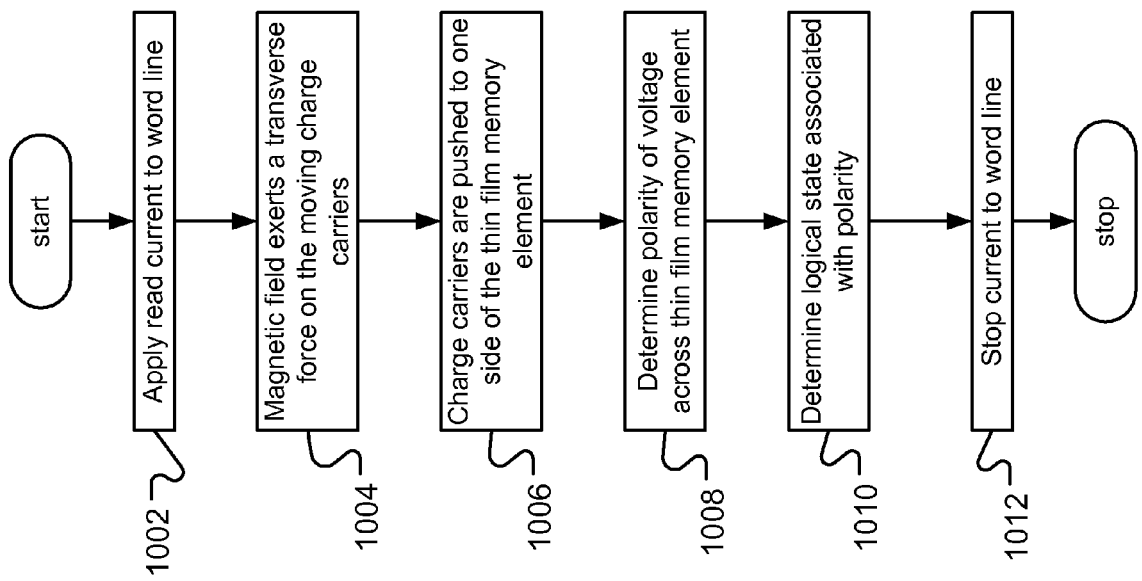
FIG. 10 shows a logical flow diagram of a read operation consistent with the first and second embodiments of the MRAM cell described in FIG. 2 and FIG. 6.

FIG. 10 shows a logical flow diagram of a read operation consistent with the first and second embodiments of an MRAM cell described in FIG. 2 and FIG. 6. First, a current is applied to a word line at 1002. The current may be of a magnitude of 1 mA. In accordance with the Hall effect, a magnetic field then exerts a transverse force on the moving charge carriers, at 1004 and the charge carriers are pushed to one side of the thin film memory element, at 1006. The polarity of the voltage across the thin film memory element is then determined, at 1008. This may be done by measuring the voltage across the thin film memory element over a bit line. Next, the logical state associated with the polarity of voltage may be determined at 1010, and the current to the word line may be stopped, at 1012.

While various embodiments in accordance with the principles disclosed herein have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A magnetic random access memory (MRAM) cell comprising:
   a word line;
   a bit line; and
   a planar magnetic thin film memory element located at an intersection of the word line and the bit line, wherein the magnetic thin film memory element comprises only magnetic material in one or more planar magnetic layers, the magnetic layers comprising an alloy of a rare earth element and a transition metal element, wherein the word line is operable to provide a current to heat the magnetic thin film memory element to a predetermined threshold and thereby reduce coercivity of the memory element.

2. An MRAM memory cell according to claim 1, wherein the heating current in combination with a magnetic field from current passing through a neighboring word line sufficient to switch the magnetic state of the magnetic thin film memory element.

3. An MRAM memory cell according to claim 1, wherein a material selection for the magnetic thin film memory element is optimized to have an increased reduction in coercivity for a small temperature change, and an increased extraordinary Hall coefficient.

4. An MRAM memory cell according to claim 1, wherein the magnetic thin film memory element has a planar cross-shaped profile, the element being substantially centered at the intersection.

5. An MRAM memory cell according to claim 1, wherein the bit line is substantially orthogonal to the word line.

6. An MRAM memory cell according to claim 1, further comprising a first write line free of electrical connection to any MRAM memory cell, wherein the first write line is parallel to the word line and proximate to the memory element, and wherein the heating current in combination with a magnetic field from current passing through the first write line is sufficient to switch the magnetic state of the magnetic thin film memory element.

7. An MRAM memory cell according to claim 6, further comprising a second write line also free of electrical connection to any MRAM memory cell, wherein the second write line is parallel to the first write line and proximate to an opposite side of the memory element than the first write line, and wherein the heating current in combination with a magnetic field from current passing through the first and second write lines sufficient to switch the magnetic state of the magnetic thin film memory element.

8. A method of writing to a magnetic random access memory (MRAM) cell, the method comprising:
   applying a heating current to a word line to heat a magnetic memory element to a threshold temperature to reduce coercivity of the memory element, wherein the memory element comprises only magnetic material in one or more planar magnetic layers, the magnetic layers comprising an alloy of a rare earth element and a transition metal element;
   when the threshold temperature is met, applying current to a line to generate a magnetic field at the memory element, wherein the line is parallel to the word line and proximate to the memory element; and
   switching a magnetic state of the memory element by the combination of the reduced coercivity and the generated magnetic field.

9. A method of writing to an MRAM cell according to claim 8, wherein the line to generate a magnetic field comprises a neighboring word line connected to a neighboring memory element.

10. A method of writing to an MRAM cell according to claim 8, wherein the line to generate a magnetic field comprises a first parallel write line proximate to the magnetic memory layer and free of electrical connection to any memory element.

11. A method of writing to an MRAM cell according to claim 10, wherein the line to generate a magnetic field further comprises a second write line parallel to the first write line and proximate to an opposite side of the memory element than the first parallel write line.

12. A method of manufacturing a magnetic random access memory (MRAM) cell, the method comprising:
   forming a word line;
   forming a bit line; and
   forming a magnetic thin film memory element comprising only magnetic material in one or more planar magnetic layers, and located at an intersection of the word line and the bit line, wherein the magnetic layers comprise an alloy of a rare earth element and a transition metal element, wherein the word line is operable to provide a current to the memory element capable of heating the magnetic thin film memory element to a threshold temperature.

13. A method of manufacturing according to claim 12, wherein the forming the magnetic thin film memory element comprises forming a planar cross-shaped profile, the element being substantially centered at the intersection.

14. A method of manufacturing according to claim 12, further comprising forming a first write line free of electrical connection to any memory element, the first write line parallel to the word line and proximate to the memory element, and wherein the heating current in combination with a magnetic field from current passing through the first write line is sufficient to switch the magnetic state of the magnetic thin film memory element.

15. An MRAM memory cell according to claim 14, further comprising a second write line also free of electrical connection to any memory element, wherein the second write line is parallel to the first write line and proximate to an opposite side of the memory element than the first write line, and wherein the heating current in combination with a magnetic field from current passing through the first and second write lines is sufficient to switch the magnetic state of the magnetic thin film memory element.

16. A magnetic random access memory (MRAM) cell comprising:
   a word line;
   a bit line;
   a magnetic thin film memory element comprising only magnetic material in one or more planar magnetic layers, and located at an intersection of the word line and the bit line, wherein the word line is operable to apply a current to the magnetic thin film memory element and thereby reduce coercivity of the memory element to a predetermined threshold;
   a write line parallel to the word line and proximate to the memory element, wherein the reduced coercivity in combination with a magnetic field from current passing through the write line is sufficient to switch the magnetic state of the magnetic thin film memory element.

17. An MRAM cell according to claim 16, wherein the magnetic layers comprise an alloy of a rare earth element and a transition metal element.

18. An MRAM cell according to claim 16, wherein the write line comprises a word line for a second magnetic thin film memory element comprising only one or magnetic layers neighboring the first memory element.

19. An MRAM cell according to claim 16, wherein in the write line is free of electrical connection to any memory element.

20. An MRAM cell according to claim 16, further comprising a second write line parallel to the first write line and proximate to an opposite side of the memory element than the first write line, and wherein the reduced coercivity in combination with a magnetic field from current passing through the first and second write lines switches the magnetic state of the magnetic thin film memory element.

* * * * *